US010008290B2

(12) United States Patent
Lee et al.

(10) Patent No.: US 10,008,290 B2
(45) Date of Patent: Jun. 26, 2018

(54) REPAIR CONTROL DEVICE AND SEMICONDUCTOR DEVICE INCLUDING THE SAME

(71) Applicant: SK hynix Inc., Icheon-si Gyeonggi-do (KR)

(72) Inventors: Seol Hee Lee, Icheon-si (KR); Kang Seol Lee, Seoul (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days. days.

(21) Appl. No.: 15/492,493

(22) Filed: Apr. 20, 2017

(65) Prior Publication Data
US 2018/0130547 A1 May 10, 2018

(30) Foreign Application Priority Data
Nov. 7, 2016 (KR) .......................... 10-2016-0147483

(51) Int. Cl.
*G11C 29/00* (2006.01)
*G11C 17/16* (2006.01)
*G11C 8/10* (2006.01)

(52) U.S. Cl.
CPC ................ *G11C 29/76* (2013.01); *G11C 8/10* (2013.01); *G11C 17/16* (2013.01); *G11C 29/78* (2013.01)

(58) Field of Classification Search
CPC ........... G11C 17/00; G11C 29/76; G11C 8/10; G11C 29/78; G11C 17/16

USPC .......................................................... 365/96
See application file for complete search history.

(56) References Cited

U.S. PATENT DOCUMENTS

2010/0284233 A1   11/2010 Kim et al.
2015/0221361 A1*  8/2015 Lee ........................ G11C 17/16
                                                          365/96

FOREIGN PATENT DOCUMENTS

KR          100902122 B1     6/2009

* cited by examiner

*Primary Examiner* — Harry W Byrne
(74) *Attorney, Agent, or Firm* — William Park & Associates Ltd.

(57) ABSTRACT

A repair control device for memory cells divided into a plurality of banks may include a failed address storage circuit configured to sort and store a plurality of failed addresses each containing a failed bank address and a failed row address, according to the failed row address, and store the failed row address by matching the failed row address with total failed bank information representing one or more failed banks indicated by the failed row address. The repair control device also includes an address comparison circuit configured to compare an input address to a pair comprised of the failed row address and the total failed bank information, stored in the failed address storage circuit, and generate a hit signal based on the comparison result. The repair control device further includes an address generation circuit configured to generate an access target address based on the hit signal.

20 Claims, 8 Drawing Sheets

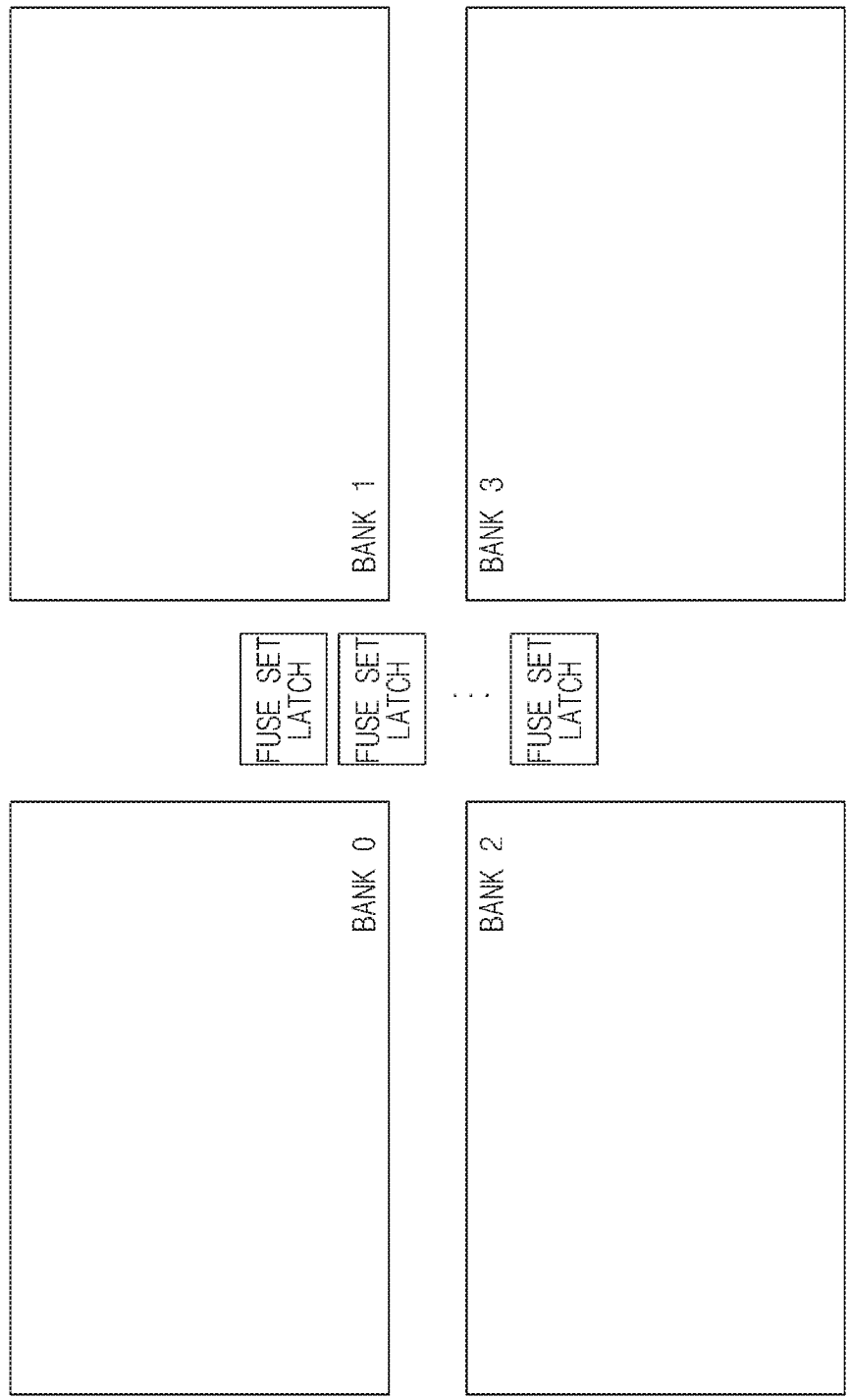

REPAIR CONTROL DEVICE AND SEMICONDUCTOR DEVICE INCLUDING THE SAME

CROSS-REFERENCES TO RELATED APPLICATION

The present application claims priority under 35 U.S.C. § 119(a) to Korean application number 10-2016-0147483, filed on Nov. 7, 2016, in the Korean Intellectual Property Office, which is incorporated herein by reference in its entirety.

BACKGROUND

1. Technical Field

Various embodiments relate to a repair control device and a semiconductor including the same, and more particularly, to a technique for storing a failed address in a nonvolatile memory.

2. Related Art

In general, a semiconductor device includes a large number of memory cells. Recently, the development of process technology has increased the integration density of the semiconductor device, thereby further increasing the number of memory cells. However, when any one of the memory cells has a defect, the semiconductor device may malfunction. Therefore, if the semiconductor device including a defective cell does not perform a desired operation, the semiconductor device cannot be used.

Recently, however, with the development of a process technology for a semiconductor device, a defect is likely to occur only in a small number of memory cells. When the entire semiconductor device is discarded as a defective product due to such a small number of defects, this is very inefficient in terms of the yield of products. Therefore, to solve such a problem, the semiconductor device additionally includes redundancy memory cells as well as normal memory cells.

In this configuration, the semiconductor device includes a redundancy control circuit. When a defect occurs in a normal memory cell, the redundancy control circuit recognizes the defect through a test in advance. Then, when an access request for the normal memory cell is made, the redundancy control circuit switches access to a redundancy memory cell from the defective normal memory cell. That is, the redundancy memory cell is provided to repair the defective normal memory cell (hereafter, referred to as 'failed cell').

Specifically, when a failed cell is accessed during a read/write operation, a normal memory cell may be accessed instead of the failed cell. At this time, the accessed normal memory cell is a redundancy memory cell.

Therefore, even though the address of a failed cell (hereafter, referred to as 'failed address') is inputted, the semiconductor device is assured of a normal operation because an operation for accessing a redundancy memory cell instead of the failed cell (hereafter, referred to as 'repair operation') is performed.

For such a repair operation, a failed cell may be found during a fabrication process of a semiconductor device, and the failed address thereof may be stored in the semiconductor device in advance. At this time, when the number of failed cells increases, the number of failed addresses also increases. Then, since the semiconductor device requires more circuits for storing the failed addresses, the yield may be reduced.

SUMMARY

Various embodiments are directed to a repair control device capable of effectively storing failed addresses and a semiconductor device including the same.

In an embodiment of the present disclosure, a repair control device for memory cells divided into a plurality of banks may include: a failed address storage circuit configured to sort and store a plurality of failed addresses each containing a failed bank address and a failed row address, according to the failed row address, and store the failed row address by matching the failed row address with total failed bank information representing one or more failed banks indicated by the failed row address; an address comparison circuit configured to compare an input address to a pair comprised of the failed row address and the total failed bank information, stored in the failed address storage circuit, and generate a hit signal based on the comparison result; and an address generation circuit configured to generate an access target address based on the hit signal.

In an embodiment of the present disclosure, a semiconductor device may include: a nonvolatile memory configured to store a plurality of failed addresses each containing a failed bank address and a failed row address; and a repair control device configured to sort and store a failed address outputted from the nonvolatile memory according to the failed row address, wherein the repair control device matches the failed row address with total failed bank information representing one or more failed banks indicated by the failed row address, and stores the failed row address.

BRIEF DESCRIPTION OF THE DRAWINGS

Features, aspects, and embodiments are described in conjunction with the attached drawings, in which:

FIG. 6B is a diagram illustrating a bank architecture when fuse set latches of the failed address storage circuit of FIG. 1 are not divided for each bank.

DETAILED DESCRIPTION

Hereinafter, a repair control device and a semiconductor device according to the present disclosure will be described below with reference to the accompanying drawings through exemplary embodiments.

Figure 1:
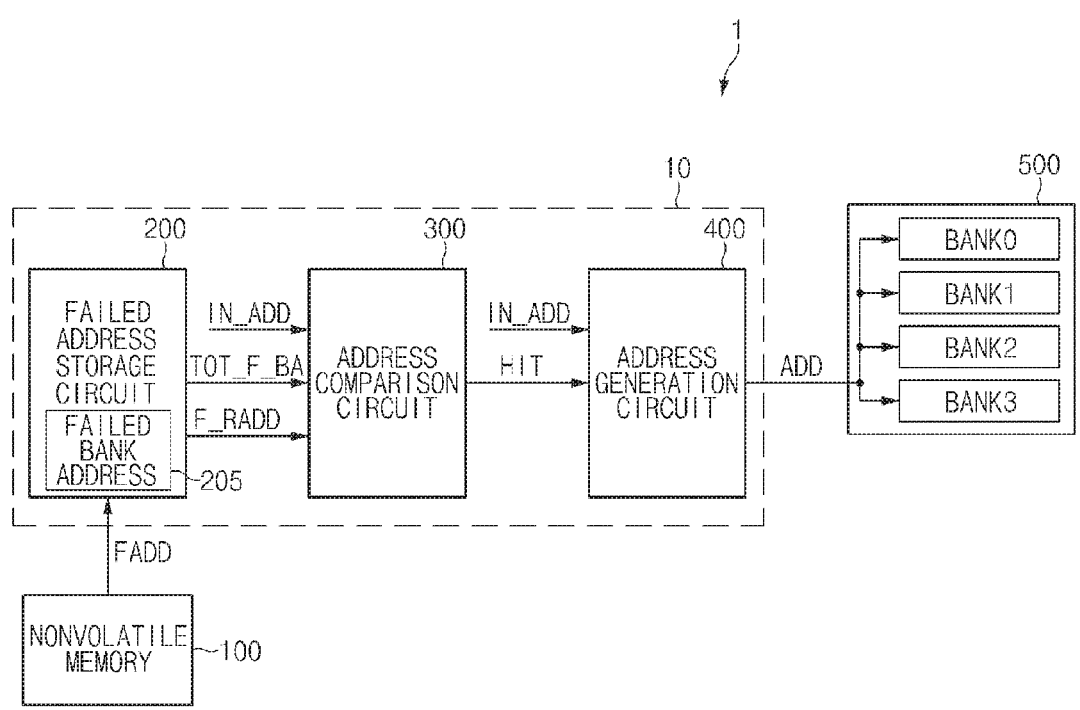
FIG. 1 is a configuration diagram of a semiconductor device according to an embodiment.

FIG. 1 is a configuration diagram of a semiconductor device 1 according to an embodiment.

Referring to FIG. 1, the semiconductor device 1 according to the present embodiment includes a repair control device 10, a nonvolatile memory 100 and a memory cell array 500.

The nonvolatile memory 100 stores a plurality of addresses of failed cell(s), that is, failed addresses FADD. The failed address FADD may be detected during a fabrication process of the semiconductor device 1, and stored in the nonvolatile memory 100 in advance. The nonvolatile memory 100 may include any one of an E-fuse array circuit, NAND flash memory, NOR flash memory, Erasable Programmable Read Only Memory (EPROM), Electrically Erasable Programmable ROM (EEPROM), Ferroelectric Random Access Memory (FRAM), and Megnetoresistive RAM (MRAM).

The repair control device 10 compares an input address IN_ADD and the failed address FADD, and generates a final address ADD for accessing the memory cell array 500. The repair control device 10 includes a failed address storage circuit 200, an address comparison circuit 300, and an address generation circuit 400.

When power is applied to the semiconductor device 1, the failed address storage circuit 200 converts the failed address FADD stored in the nonvolatile memory 100 and stores the converted address therein.

In order to compare the input address IN_ADD and the failed address FADD, the repair control device 10 may access the nonvolatile memory 100 to read the failed address FADD, whenever the input address IN_ADD is inputted. In this case, however, because the nonvolatile memory 100 requires a long read time, the whole operation speed may be lowered. Furthermore, the repair control device 10 needs to have a circuit for accessing a specific cell of the nonvolatile memory 100. Thus, the repair control device 10 includes the failed address storage circuit 200 for storing all the failed addresses FADD stored in the nonvolatile memory 100 when power is applied.

The failed address storage circuit 200 sequentially converts the plurality of failed addresses FADD transmitted from the nonvolatile memory 100, and stores the converted addresses. The failed address storage circuit 200 sorts and stores the failed addresses FADD according to a failed row address F_RADD. That is, the failed address storage circuit 200 of the repair control device 10 matches a failed row address F_RADD with total failed bank information TOT_F_BA representing one or more failed banks indicated by the failed row address F_RADD, and stores the failed row address F_RADD. The failed address storage circuit 200 will be described in detail with reference to FIG. 2.

The address comparison circuit 300 compares the input address IN_ADD to the failed address FADD stored in the failed address storage circuit 200, that is, a pair comprised of the total failed bank information TOT_F_BA and the failed row address F_RADD, and generates a hit signal HIT based on a comparison result. At this time, the address comparison circuit 300 may compare a value obtained by decoding the bank address (hereafter, referred to as input bank address) of the input address IN_ADD to the total failed bank information TOT_F_BA stored in the failed address storage circuit 200, and may compare the row address (hereafter, referred to as input row address) of the input address IN_ADD to the failed row address F_RADD stored in the failed address storage circuit 200. The hit signal HIT may be generated for each pair of the total failed bank information TOT_F_BA and the failed row address F_RADD, stored in the failed address storage circuit 200.

The address generation circuit 400 generates a final address (access target address) ADD based on the comparison performed by the address comparison circuit 300. The address generation circuit 400 may generate a repair address corresponding to the input address IN_ADD as the final address ADD, when the hit signal HIT is enabled. On the other hand, the address generation circuit 400 may generate the input address IN_ADD as the final address ADD, when the hit signal HIT is disabled.

Figure 2:
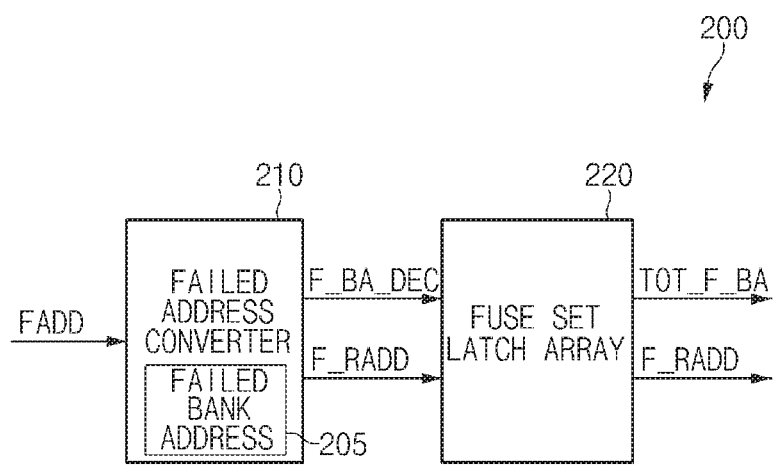
FIG. 2 is a configuration diagram of a failed address storage circuit of FIG. 1.

FIG. 2 is a detailed configuration diagram of the failed address storage circuit 200 of FIG. 1.

Referring to FIG. 2, the failed address storage circuit 200 includes a failed address converter 210 and a fuse set latch array 220.

The failed address converter 210 converts the failed address FADD transmitted from the nonvolatile memory 100. Specifically, the failed address converter 210 separates the failed address FADD into a failed bank address or failed bank address 205 and the failed row address F_RADD. The failed address converter 210 generates a failed bank indication signal or failed bank indication signal F_BA_DEC based on the failed bank address 205.

The failed bank indication signal F_BA_DEC indicates at which bank a failed cell indicated by the failed address FADD is located. The failed bank indication signal F_BA_DEC may have bits corresponding to the number of banks. The failed address converter 210 may generate the failed bank indication signal F_BA_DEC based on a result obtained by decoding the failed bank address 205.

For example, when the memory cell array 500 is divided into four banks BANK0 to BANK4 as illustrated in FIG. 1, the failed address FADD may contain a 2-bit failed bank address 205. The failed bank indication signal F_BA_DEC may have four bits corresponding to the number of banks. At this time, under the supposition that the failed bank address 205 indicates "00" or the bank BANK0, a value obtained by decoding the failed bank address 205 becomes "0001". That is, the bit indicating the bank BANK0 is set to 1, and the bits indicating the other banks BANK1 to BANK3 are set to 0. Thus, the failed bank indication signal F_BA_DEC becomes "0001". At this time, the level of each bit of the failed bank indication signal F_BA_DEC is only an example, and may be set to the opposite level. Furthermore, the failed address converter 210 sets the value of the fuse set latch array 220 using the failed bank indication signal F_BA_DEC and the failed row address F_RADD.

Figure 3:
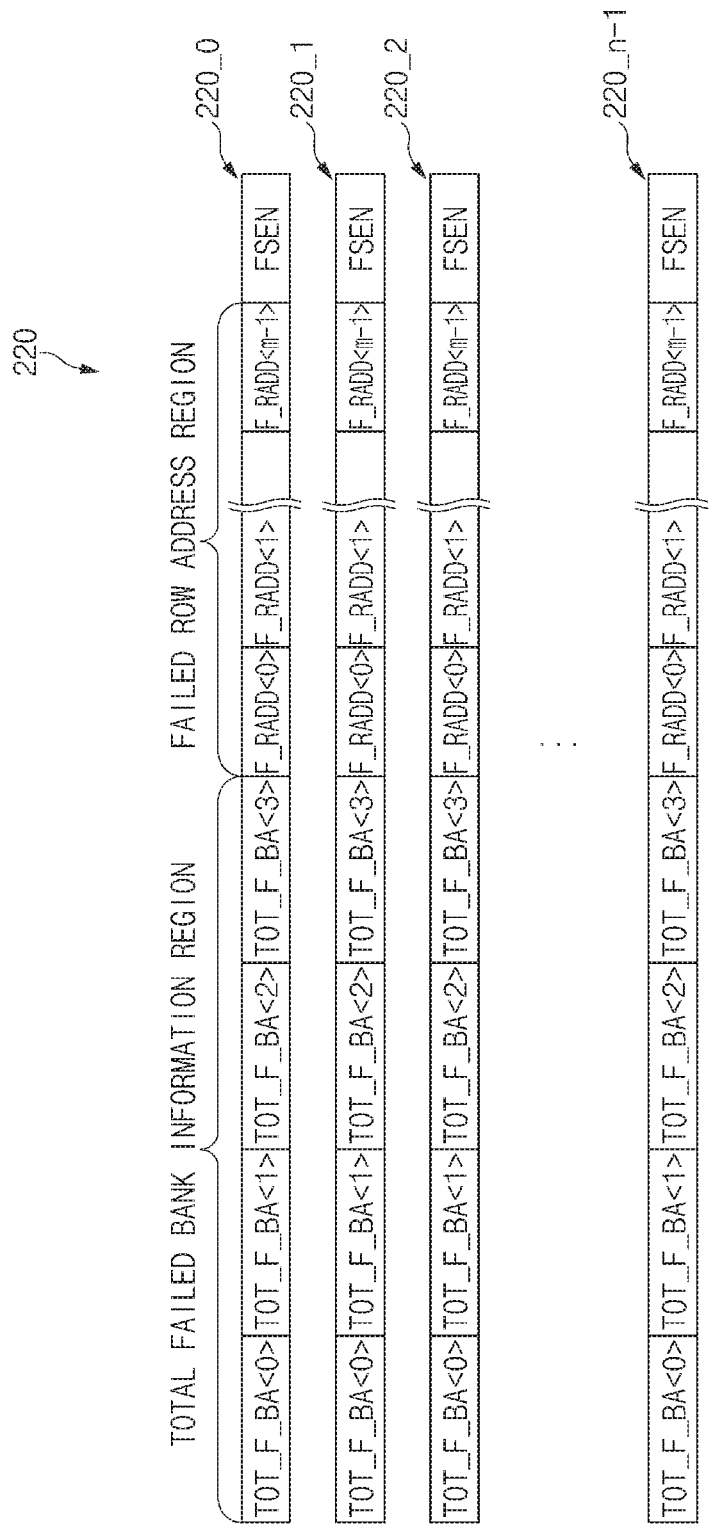
FIG. 3 is a detailed configuration diagram of a fuse set latch array of FIG. 2.

FIG. 3 is a detailed configuration diagram of the fuse set latch array 220.

Referring to FIG. 3, the fuse set latch array 220 includes a plurality of fuse set latches 220_0 to 220_n-1. Each of the fuse set latches 220_0 to 200_n-1 includes a total failure bank information region or failed bank information region and a failure row address region or failed row address region. The total failed bank information region may be for storing total failed bank information TOT_F_BA, and the failed row address region may be for storing a failed row address F_RADD.

The total failed bank information TOT_F_BA indicates one or more banks covered by the corresponding failed row address F_RADD, and has bits corresponding to the number of banks. Because the present embodiment is based on the supposition that the memory cell array 500 of FIG. 1 includes four banks BANK0 to BANK3, the total failed bank information TOT_F_BA<0:3> is a 4-bit signal. The total failed bank information region for storing total failed bank information TOT_F_BA<0:3> of a fuse set latch 220_0 to 200_n-1 also has four bits.

The present embodiment is based on the supposition that the row address F_RADD<0:m-1> of the failed address FADD has m bits. That is, the failed row address region included in each of the fuse set latches 220_0 to 220_n-1 has m bits.

The fuse set latch array 220 may include a fuse set latch enable signal FSEN. The fuse set latch enable signal FSEN is generated based on a fuse set enable signal which has been stored in the nonvolatile memory 100. The nonvolatile memory 100 is configured to have a specific value of 0, for example, in the initial state where no data is stored. In this case, when data '0' is written to the nonvolatile memory 100, it is difficult to determine whether no data is not yet stored in the nonvolatile memory 100 or whether data '0' is written to the nonvolatile memory 100. Therefore, the fuse set enable signal may be set to a specific value of '1', for example, in order to indicate that data is stored. The nonvolatile memory 100 may include a fuse set array having a plurality of fuse sets. Furthermore, the fuse set enable signal may be set to a specific value in order to indicate whether data is stored in each fuse set of the fuse set array.

Each of the fuse set latches 220_0 to 220_n-1 of the fuse set latch array 220 may store the fuse set latch enable signal FSEN based on the above-described fuse set enable signal stored in the nonvolatile memory 100. The fuse set latch array 220 may store the initial value of '0', for example. When a boot-up signal is enabled as power is applied to the semiconductor device 1, the failed addresses FADD are sequentially transmitted to the failed address converter 210 of the failed address storage circuit 200 from the nonvolatile memory 100. The failed address converter 210 sorts and stores the failed addresses FADD in the fuse set latches 220_0 to 220_n-1 according to the failed row addresses F_RADD. The failed address converter 210 stores the fuse set enable signals corresponding to the failed addresses FADD as the fuse set latch enable signals FSEN in the fuse set latches 220_0 to 220_n-1, respectively.

Basically, the failed address converter 210 stores the failed row address F_RADD in the failed row address region of one of the fuse set latches 220_0 to 220_n-1. The failed address converter 210 converts the failed bank address 205 into the failed bank indication signal F_BA_DEC indicated by the failed address FADD. Then, the failed address converter 210 enables a bit of the total failed bank information region, corresponding to a bit of the failed bank indication signal F_BA_DEC, to a predetermined value of '1', for example, based on a result obtained by decoding the failed bank address 205. For example, when the memory cell array 500 is divided into four banks as illustrated in FIG. 1 and the failed bank address 205 is "00", the failed bank indication signal F_BA_DEC<0:3> becomes "1000". Therefore, the failed address converter 210 sets the first bit TOT_F_BA<0> of the total failed bank information TOT_F_BA of the total failed bank information region to '1'.

At this time, a failed row address F_RADD' of a failed address FADD', which is to be stored in the fuse set latch array 220, may be already stored in the failed row address region of any one of the fuse set latches 220_0 to 220_1, for example, the fuse set latch 220_k. In other words, the failed row address F_RADD of the failed address FADD, which is already stored, may be equal to the failed row address F_RADD' of the failed address FADD', which is to be stored (that is, F_RADD=F_RADD'). In this case, the failed address converter 210 generates a failed bank indication signal F_BA_DEC' by converting the failed bank address 205 of the failed address FADD'. Then, the failed address converter 210 disables a bit of the total failed bank information region of the fuse set latch 220_k, the bit corresponding to an enabled bit of the failed bank indication signal F_BA_DEC'. For example, when the failed bank indication signal F_BA_DEC<0:3> of the failed address FADD' is "0010", the third bit TOT_F_BA<2> of the total failed bank information region of the fuse set latch 220_k may be set to '1'. That is, the total failed bank information TOT_F_BA<0:3> of the total failed bank information region of the fuse set latch 220_k is set to "1010".

In other words, when the failed row addresses F_RADD and F_RADD' of two failed addresses FADD and FADD' are equal to each other, the same failed row address F_FADD or F_RADD' is stored in the failed row address region of one fuse set latch 220_k, and a bank indicated by the failed row address F_FADD or F_RADD' is represented by the total failed bank information region of the fuse set latch 220_k. Thus, two failed addresses FADD and FADD' may be stored in one fuse set latch 220_k.

According to the present embodiment, when failures occurred at the same row address for a plurality of banks, failed addresses for the plurality of banks may be stored in one fuse set latch. Therefore, compared to when failed addresses are sorted and stored for the respective banks, the number of storage regions for the failed addresses, that is, the number of fuse set latches can be reduced.

The address comparison circuit 300 of the repair control device 10 in the semiconductor device 1 compares the input address IN_ADD to the converted failed address FADD transmitted from the failed address storage circuit 200, that is, the pair of the total failed bank information TOT_F_BA and the failed row address F_RADD, and generates the hit signal HIT based on the comparison result.

Figure 4:
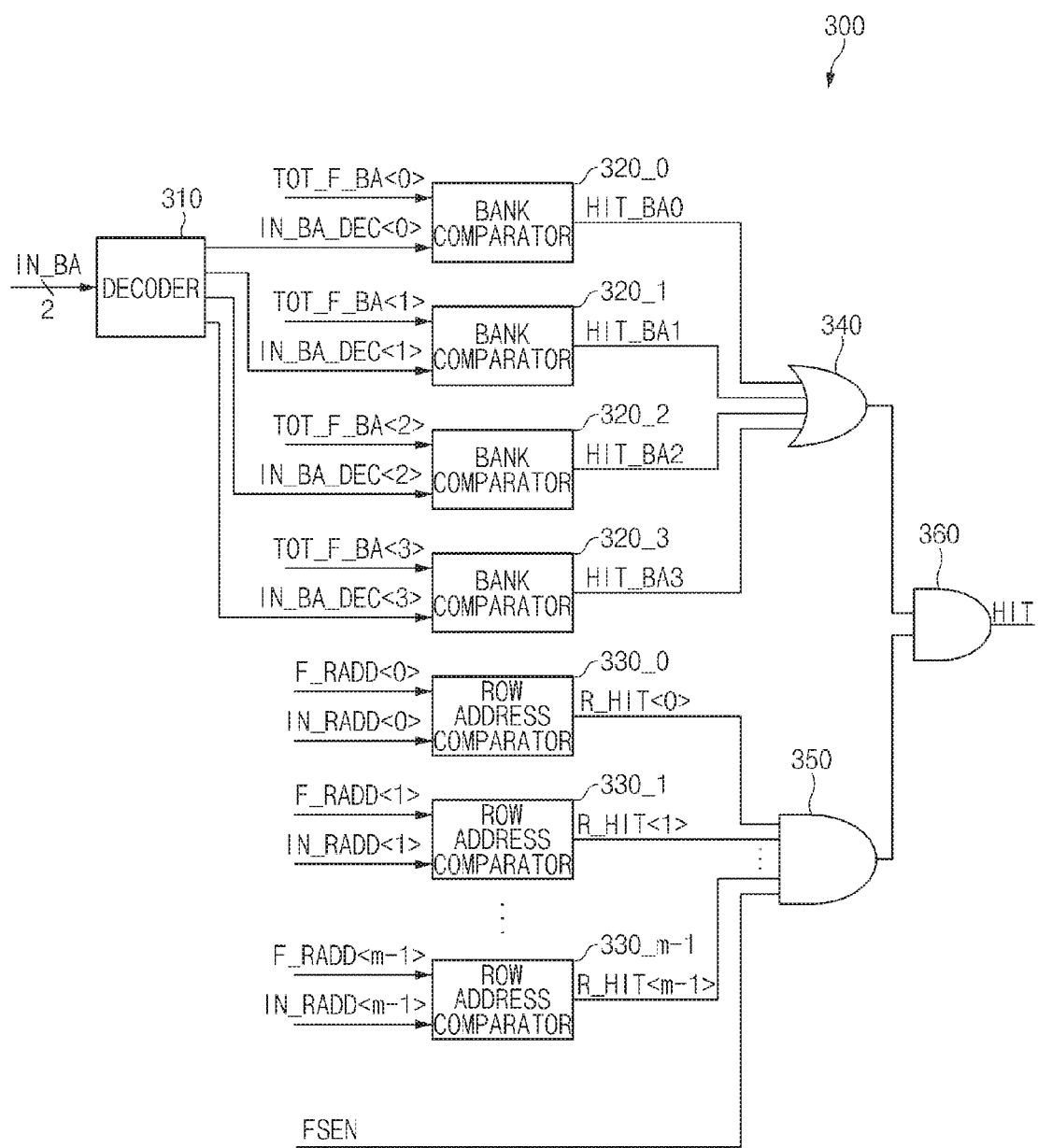
FIG. 4 is a configuration diagram of an address comparison circuit of FIG. 1.

FIG. 4 is a detailed configuration diagram of the address comparison circuit 300. FIG. 4 illustrates a configuration for comparing an input address IN_ADD to outputs the total failed bank information TOT_F_BA<0:3>, the failed row address F_RADD<0:m-1>, and the fuse set latch enable signal FSEN of one fuse set latch of the fuse set latch array 220. When n fuse set latches 220_0 to 220_n-1 are installed as illustrated in FIG. 3, n address comparison circuits 300 are required in the configuration of FIG. 4. Thus, n hit signals HIT are generated.

Referring to FIG. 4, the address comparison circuit 300 includes a decoder (input address converter) 310, bank comparators 320_0 to 320_3, row address comparators 330_0 to 330_m-1, an OR operator 340, an AND operator 350, and an AND operator 360.

The input address IN_ADD includes an input bank address IN_BA and an input row address IN_RADD. The present embodiment is based on the supposition that the failed bank address 205 of the failed address FADD has two bits and the failed row address F_RADD has m bits. Thus, the input address IN_ADD has the same number of bits as the failed address FADD. That is, the input bank address IN_BA has two bits, and the input row address IN_RADD has m bits.

The decoder 310 may convert the input bank address IN_BA into an input bank indication signal IN_BA_DEC indicated by the input address IN_ADD. The decoder 310 may generate the input bank indication signal IN_BA_DEC based on a result obtained by decoding the input bank address IN_BA of the input address IN_ADD. That is, the decoder 310 performs a similar operation to the operation of the failed address converter 210 which generates the failed bank indication signal F_BA_DEC by converting the failed bank address 205 of the failed address FADD. In the present embodiment, because the input bank address IN_BA has two bits, a 4-bit input bank indication signal IN_BA_DEC<0:3> is generated. Only one bit of the input bank indication signal IN_BA_DEC<0:3> is enabled, and the other bits are disabled.

The bank comparators 320_0 to 320_3 compare the values of the total failed bank information TOT_F_BA<0:3> stored in the total failed bank information regions of the respective fuse set latches 220_0 to 220_n-1 of the fuse set latch array 220 of the failed address storage circuit 200 to the corresponding values of the input bank indication signal IN_BA_DEC<0:3> outputted from the decoder 310. The number of the bank comparators 320_0 to 320_3 corresponds to the number of bits contained in the total failed bank information TOT_F_BA<0:3> or the input bank indication signal IN_BA_DEC<0:3>. That is, four bank comparators are installed.

When the values of the total failed bank information TOT_F_BA<0:3> are equal to the corresponding values of the input bank indication signal IN_BA_DEC<0:3>, the bank comparators 320_0 to 320_3 enable the corresponding bank hit signals HIT_BA0 to HIT_BA3. When the values of the total failed bank information TOT_F_BA<0:3> are different from the corresponding values of the input bank indication signal IN_BA_DEC<0:3>, the bank comparators 320_0 to 320_3 disable the corresponding bank hit signals HIT_BA0 to HIT_BA3.

The row address comparators 330_0 to 330_m-1 compare the values of the failed row address F_RADD<0:m-1> to the corresponding values of the input row address IN_RADD<0:m-1>. Because the row address comparators 330_0 to 330_m-1 compare the values of the failed row address F_RADD<0:m-1> to the corresponding values of the input row address IN_RADD<0:m-1>, the number of row address comparators 330_0 to 330_m-1 corresponds to the number of bits contained in the failed row address F_RADD<0:m-1> or the input row address IN_RADD<0:m-1>. That is, m row address comparators are installed.

When the comparison results of the row address comparators 330_0 to 330_m-1 indicate that the values of the failed row address F_RADD<0:m-1> are equal to the corresponding values of the input row address IN_RADD<0:m-1>, the row address comparators 330_0 to 330_m-1 enable the corresponding row hit signals R_HIT<0> to R_HIT<m-1>. When the comparison results of the row address comparators 330_0 to 330_m-1 indicate that the values of the failed row address F_RADD<0:m-1> are different from the corresponding values of the input row address IN_RADD<0:m-1>, the row address comparators 330_0 to 330_m-1 disable the corresponding row hit signals R_HIT<0> to R_HIT<m-1>.

The OR operator 340 performs an OR operation on the bank hit signals HIT_BA0 to HIT_BA3. That is, the OR operator 340 determines whether one or more pairs among the pairs of the total failed bank indication signals TOT_F_BA<0> to TOT_F_BA<3> and the input bank indication signals IN_BA_DEC<0> to IN_BA_DEC<3> are equal to each other.

As described above, the failed address storage circuit 200 sorts and stores the failed addresses FADD according to the failed row addresses F_RADD. Thus, a plurality of bits of the total failed bank information TOT_F_BA<0:3> may be enabled. On the other hand, one bit of the input bank indication signal IN_BA_DEC<0:3> is enabled. Therefore, the bank comparators 320_0 to 320_3 and the OR operator 340 determines whether the enabled bit of the input bank indication signal IN_BA_DEC<0:3> corresponds to one of the enabled bits of the total failed bank information TOT_F_BA<0:3>.

The AND operator 350 performs an AND operation on the row hit signals R_HIT<0> to R_HIT<m-1>. At this time, the fuse set latch enable signal FSEN may also be inputted to the AND operator 350 with the row hit signals R_HIT<0> to R_HIT<m-1>. That is because, only when the fuse set latch enable signal FSEN is enabled, the failed row addresses F_RADD<0> to F_RADD<m-1> are valid.

The row address comparators 330_0 to 330_m-1 and the AND operator 350 determine whether the bits of the failed row address IN_RADD<0:m-1> are equal to the corresponding bits of the input row address IN_RADD<0:m-1>.

The AND operator 360 performs an AND operation on an output value of the OR operator 340 and an output value of the AND operator 350, and generates the hit signal HIT based on the operation result. The AND operator 360 may enable the hit signal HIT when the output value of the OR operator 340 and the output value of the AND operator 350 are both enabled.

According to such a configuration, the address comparison circuit 300, enables the hit signal HIT when the input bank indication signal IN_BA_DEC<0:3> corresponds to the total failed bank information TOT_F_BA<0:3> and the input row address IN_RADD<0:m-1> corresponds with the failed row address F_RADD stored in the failed address storage circuit 200. Further, the address comparison circuit 300 determines whether the input address IN_ADD corresponds to the failed address information on the plurality of banks, stored in any one of the plurality of fuse set latches 220_0 to 220_n-1 of the failed address storage circuit 200, the failed address information indicating the pair of the total failed bank information TOT_F_BA and the failed row address FRADD.

The address comparison circuit 300 of FIG. 4 is configured to compare the input address IN_ADD to the failed address information stored in any one of the plurality of fuse set latches 220_0 to 220_n-1. Thus, in order to compare the input address IN_ADD to the failed address information stored in the plurality of fuse set latches 220_0 to 220_n-1, the address comparison circuit 300 needs to be installed in each of the fuse set latches 220_0 to 220_n-1. Therefore, n hit signals HIT are generated from the n address comparison circuits 300 corresponding to the fuse set latches 220_0 to 220_n-1. Referring back to FIG. 1, the address generation circuit 400 generates the final address ADD based on the hit signal HIT.

Figure 5:
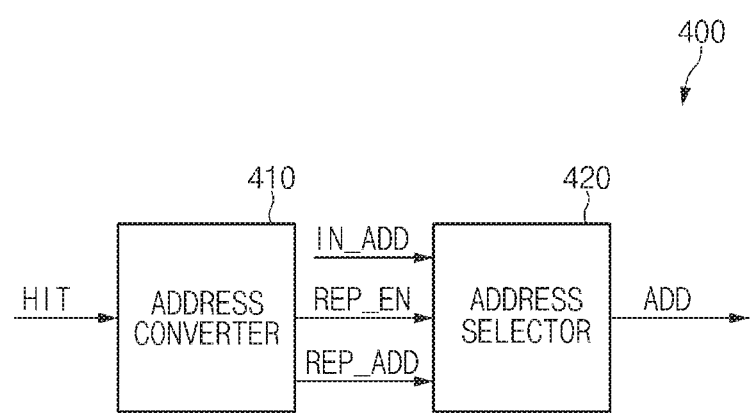
FIG. 5 is a configuration diagram of an address generation circuit of FIG. 1.

FIG. 5 is a detailed configuration diagram of the address generation circuit 400.

Referring to FIG. 5, the address generation circuit 400 includes an address converter 410 and an address selector 420.

The address converter 410 generates a repair enable signal REP_EN and a repair address REP_ADD based on the hit signal HIT.

For example, when one of n hit signals HIT generated from the n address comparison circuits 300 is enabled, it may indicate that the input address IN_ADD is the failed address FADD. Thus, the address converter 410 enables the repair enable signal REP_EN. Furthermore, the address converter 410 generates the repair address REP_ADD indicating a redundancy memory cell corresponding to the input address IN_ADD, instead of the input address IN_ADD indicating a normal memory cell. At this time, the repair address REP_ADD may be preset in response to each of the fuse set latches 220_0 to 220_n-1. When a plurality of bits are enabled at the total failed bank information region of the fuse set latches 220_0 to 220_n-1, a plurality of repair addresses REP_ADD corresponding to the bits enabled at the fuse set latches 220_0 to 220_n-1 may be set. Thus, when the hit signal HIT corresponding to a specific fuse set latch is enabled, the corresponding repair address REP_ADD is generated.

When the n hit signals HIT are all disabled, the address converter 410 disables the repair enable signal REP_EN, and does not generate the repair address REP_ADD.

The address selector 420 generates the final address ADD based on the repair enable signal REP_EN. Specifically, when the repair enable signal REP_EN is enabled, it may indicate that the input address IN_ADD is the failed address FADD. Thus, the address selector 420 selects and outputs the repair address REP_ADD as the final address ADD when, for example, the repair enable signal REP_EN is enabled. Furthermore, when the repair enable signal REP_EN is disabled, it may indicate that the input address IN_ADD is not the failed address FADD. Thus, the address selector 420 selects and outputs the input address IN_ADD as the final address ADD when, for example, the repair enable signal REP_EN is disabled.

Figure 6A:
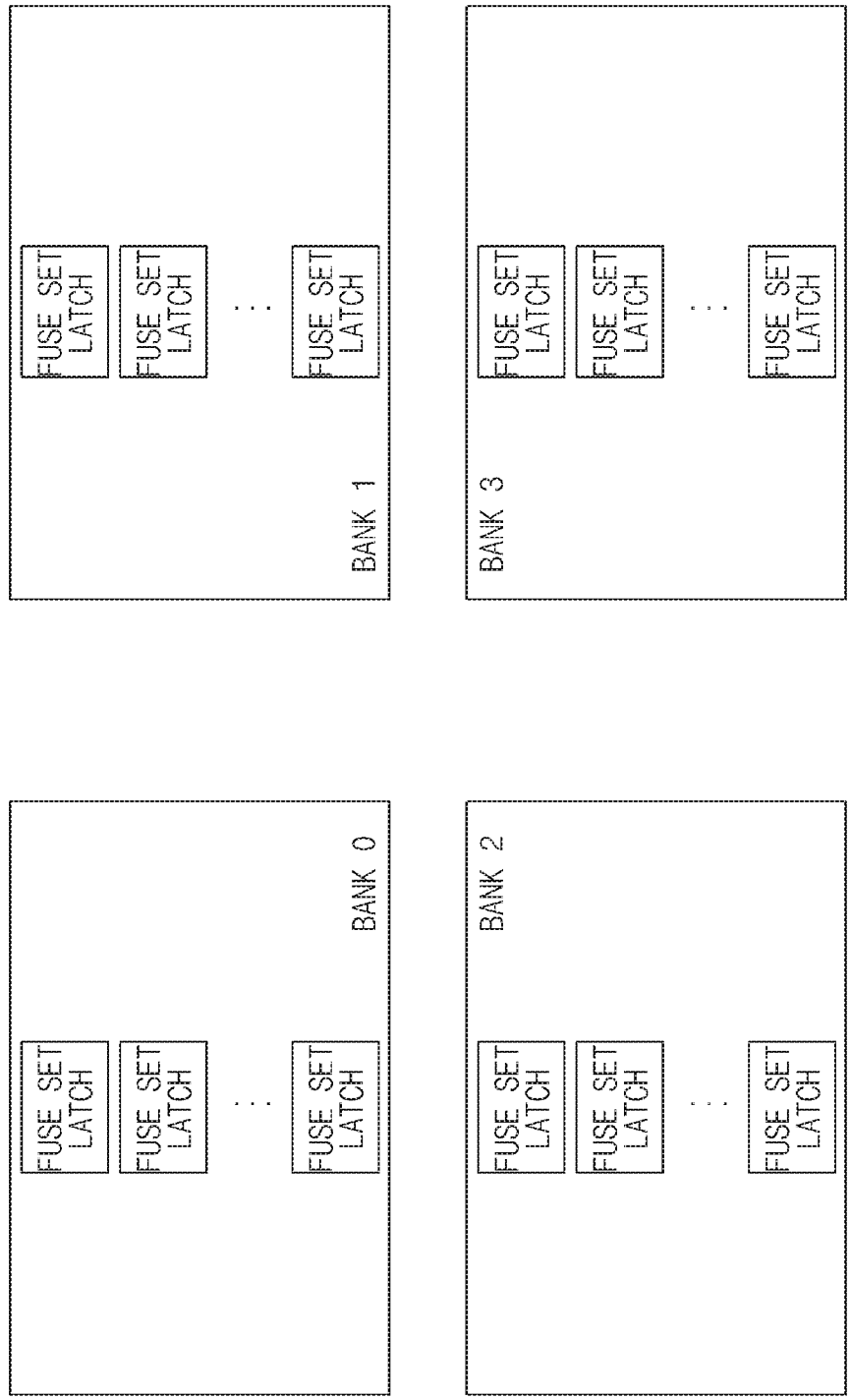
FIG. 6A is a diagram illustrating a bank architecture when fuse set latches of the failed address storage circuit of FIG. 1 are divided for each bank.

FIG. 6A illustrates a bank architecture in which the fuse set latches of the failed address storage circuit 200 are divided into the respective banks, and FIG. 6B illustrates a bank architecture in which the fuse set latches of the failed address storage circuit 200 are divided only according to the failed row addresses F_RADD, and not divided into the respective banks.

Referring to FIG. 6A, fuse set latches are allocated to each of the banks BANK0 to BANK3. Thus, when the number of failed addresses in any one of the banks BANK0 to BANK3 is larger than the number of fuse set latches allocated to the corresponding bank, failed cells cannot be all saved even though the other banks excluding any one of the banks BANK0 to BANK3 may include spare fuse set latches.

On the other hand, FIG. 6B illustrates the fuse set latches as commonly used by the banks BANK0 to BANK3. That is, according to this embodiment, when the failed addresses FADD are sorted according to the failed row addresses F_RADD and the failed row addresses FRADD matched with the total failed bank information TOT_F_BA are stored, the fuse set latches may be commonly used by the banks BANK0 to BANK3. Therefore, when the total number of fuse set latches is smaller than the number of failed addresses FADD in all the banks BANK0 to BANK3, failed cells can be saved even though the number of failed addresses in any one bank of the banks BANK0 to BANK3 is larger than the number of failed addresses in the other banks. That is, according to the present embodiment, the fuse set latches can be flexibly used.

According to the present embodiment, the repair control device and the semiconductor device can sort and store failed addresses according to a failed row address. Thus, when a failed cell is present in the same row addresses of a plurality of banks, the repair control device and the semiconductor device can only one row address. Thus, the storage area for the failed addresses can be reduced.

While certain embodiments have been described above, it will be understood to those skilled in the art that the embodiments described are by way of example only. Accordingly, the semiconductor device described herein should not be limited based on the described embodiments. Rather, the semiconductor device described herein should only be limited in light of the claims that follow when taken in conjunction with the above description and accompanying drawings.

Figure 7:
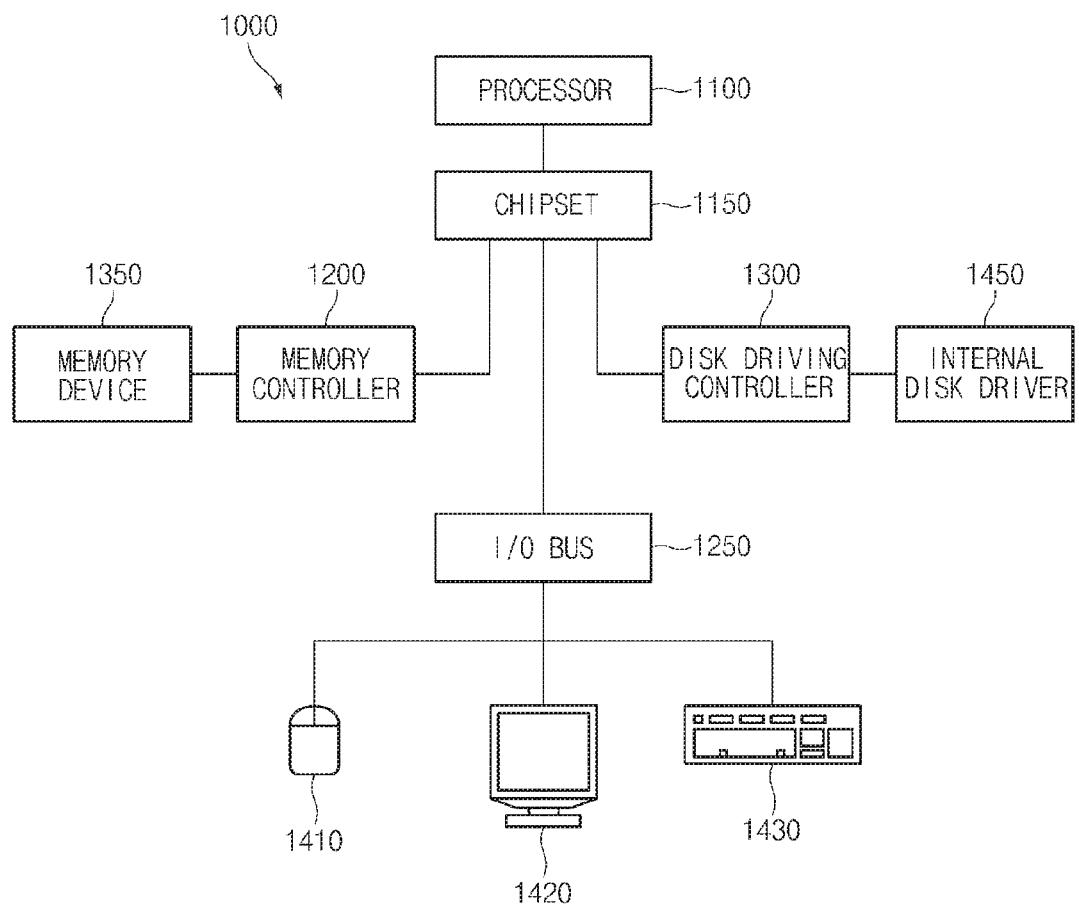
FIG. 7 illustrates a block diagram of an example of a system employing a semiconductor device in accordance with the various embodiments discussed above in relation to FIGS. 1-6.

The semiconductor device discussed above (see FIGS. 1-6) is particularly useful in the design of memory devices, processors, and computer systems. For example, referring to FIG. 7, a block diagram of a system employing a semiconductor device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device as discussed above with reference to FIGS. 1-6. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device as discussed above with relation to FIGS. 1-6, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 7 is merely one example of a system 1000 employing a semiconductor device as discussed above with relation to FIGS. 1-6. In alternate embodiments, such as, for example but not limited to, cellular phones or digital cameras, the components may differ from the embodiments illustrated in FIG. 7.

What is claimed is:

1. A repair control device for memory cells divided into a plurality of banks, comprising:
    a failed address storage circuit configured to sort and store a plurality of failed addresses each containing a failed bank address and a failed row address, according to the failed row address, and store the failed row address by matching the failed row address with total failed bank information representing one or more failed banks indicated by the failed row address;
    an address comparison circuit configured to compare an input address to a pair comprised of the failed row address and the total failed bank information, stored in the failed address storage circuit, and generate a hit signal based on the comparison result; and
    an address generation circuit configured to generate an access target address based on the hit signal.

2. The repair control device of claim 1, wherein the failed address storage circuit comprises:
    a failed address converter configured to convert the failed bank address into a failed bank indication signal indicated by the failed address, and set the total failed bank information based on the failed bank indication signal; and
    a fuse set latch array configured to store the pair of the total failed bank information and the failed row address.

3. The repair control device of claim 2, wherein the fuse set latch array comprises a total failed bank information region for storing the total failed bank information and a failed row address region for storing the failed row address.

4. The repair control device of claim 3, wherein the total failed bank information region has bits corresponding to the plurality of banks, respectively.

5. The repair control device of claim 4, wherein the failed address converter enables a bit of the total failed bank information region, the bit corresponding to the failed bank indication signal.

6. The repair control device of claim 5, wherein the failed address converter enables the bit of the total failed bank information region, corresponding to the failed bank indication signal, based on a result obtained by decoding the failed bank address.

7. The repair control device of claim 1, wherein the input address comprises an input bank address and an input row address, and
    the address comparison circuit comprises an input address converter configured to convert the input bank address into an input bank indication signal indicated by the input address.

8. The repair control device of claim 7, wherein the input address converter generates the input bank indication signal based on a result obtained by decoding the input bank address.

9. The repair control device of claim 8, wherein the address comparison circuit enables the hit signal, when the input bank indication signal corresponds to the total failed bank information and the input row address corresponds with the failed row address stored in the failed address storage circuit.

10. The repair control device of claim 1, wherein the address generation circuit comprises:
    an address converter configured to generate a repair address and a repair enable signal based on the hit signal; and
    an address selector configured to select the input address or the repair address as the access target address based on the repair enable signal.

11. The repair control device of claim 10, wherein the address converter enables the repair enable signal when the hit signal is enabled.

12. The repair control device of claim 11, wherein the address selector selects the repair address as the access target address when the repair enable signal is enabled.

13. The repair control device of claim 11, wherein the address selector selects the input address as the access target address when the repair enable signal is disabled.

14. A semiconductor device comprising:
    a nonvolatile memory configured to store a plurality of failed addresses each containing a failed bank address and a failed row address; and
    a repair control device configured to sort and store a failed address outputted from the nonvolatile memory according to the failed row address, wherein the repair control device matches the failed row address with total failed bank information representing one or more failed banks indicated by the failed row address, and stores the failed row address.

15. The semiconductor device of claim 14, wherein the repair control device comprises:
    a failed address storage circuit configured to store the failed row address matched with the total failed bank information;
    an address comparison circuit configured to compare an input address to the pair of the failed row address and the total failed bank information, stored in the failed address storage circuit, and generate a hit signal based on the comparison result; and
    an address generation circuit configured to generate an access target address based on the hit signal.

16. The semiconductor device of claim 15, wherein the failed address storage circuit comprises:
    a failed address converter configured to convert the failed bank address into a failed bank indication signal indicated by the failed address, and set the total failed bank information based on the failed bank indication signal; and
    a fuse set latch array configured to store the pair of the total failed bank information and the failed row address.

17. The semiconductor device of claim 16, wherein the fuse set latch array comprises a total failed bank information region for storing the total failed bank information and a failed row address region for storing the failed row address.

18. The semiconductor device of claim 17, wherein the total failed bank information region has bits corresponding to the respective banks.

19. The semiconductor device of claim 18, wherein the failed address converter enables a bit of the total failed bank information region, the bit corresponding to the failed bank indication signal.

20. The semiconductor device of claim 19, wherein the failed address converter enables the bit of the total failed bank information region, corresponding to the failed bank indication signal, based on a result obtained by decoding the failed bank address.

* * * * *